(12) United States Patent
Minemura (10) Patent No.: US 10,418,107 B2
(45) Date of Patent: Sep. 17, 2019

(54) METHOD FOR CONTROLLING MEMORY DEVICE

(71) Applicant: TOSHIBA MEMORY CORPORATION, Tokyo (JP)

(72) Inventor: Yoichi Minemura, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,286

(22) Filed: Feb. 27, 2018

(65) Prior Publication Data

US 2018/0277221 A1    Sep. 27, 2018

(30) Foreign Application Priority Data

Mar. 22, 2017    (JP) .................................. 2017-056416

(51) Int. Cl.
| | |
|---|---|
| *G11C 16/10* | (2006.01) |
| *H01L 23/528* | (2006.01) |
| *H01L 29/10* | (2006.01) |
| *H01L 27/11568* | (2017.01) |
| *G11C 16/04* | (2006.01) |
| *G11C 16/34* | (2006.01) |
| *H01L 29/08* | (2006.01) |
| *G11C 16/08* | (2006.01) |

(Continued)

(52) U.S. Cl.
CPC .......... *G11C 16/10* (2013.01); *G11C 16/0466* (2013.01); *G11C 16/0483* (2013.01); *G11C 16/08* (2013.01); *G11C 16/12* (2013.01); *G11C 16/3459* (2013.01); *H01L 23/528* (2013.01); *H01L 27/11568* (2013.01); *H01L 29/0847* (2013.01); *H01L 29/1037* (2013.01); *H01L 27/11565* (2013.01); *H01L 27/11582* (2013.01)

(58) Field of Classification Search
CPC . G11C 16/10; G11C 16/0466; G11C 16/0483; G11C 16/08; G11C 16/12; G11C 16/3459; H01L 23/528; H01L 27/11565; H01L 27/11568; H01L 27/11582; H01L 29/0847; H01L 29/1037
USPC ..................................................... 365/185.17
See application file for complete search history.

(56) References Cited

U.S. PATENT DOCUMENTS

| | | | |
|---|---|---|---|
| 6,894,931 B2 | 5/2005 | Yaegashi et al. | |
| 8,934,298 B2 * | 1/2015 | Park ................... | G11C 11/5628 365/185.03 |

(Continued)

FOREIGN PATENT DOCUMENTS

JP    2004-23044 A    1/2004

*Primary Examiner* — Fernando Hidalgo
(74) *Attorney, Agent, or Firm* — Kim & Stewart LLP (57) ABSTRACT

A memory device includes stacked word lines stacked and a semiconductor channel passing through the word lines in a first direction. Memory cells are disposed along the semiconductor channel in the first direction. Each memory cell includes a charge retention film between the semiconductor channel and a respective word line in the plurality of word lines. A controller is connected to the semiconductor channel and the word lines and configured to apply a program voltage during a program operation to a memory cell at a potential that increases in voltage steps, and a voltage increment between the voltage steps decreases during the program operation. The increment voltage is changed by the controller depending on a position of the memory cell along the semiconductor channel in the first direction.

17 Claims, 9 Drawing Sheets

(51) Int. Cl.
  *G11C 16/12* (2006.01)
  *H01L 27/11565* (2017.01)
  *H01L 27/11582* (2017.01)

(56) References Cited

U.S. PATENT DOCUMENTS

2014/0362643 A1* 12/2014 Yasuda .............. G11C 16/0483
                                                365/185.17
2018/0005700 A1*  1/2018 Kang .................... G11C 16/16
2018/0350830 A1* 12/2018 Lim .................. H01L 27/11582

\* cited by examiner

METHOD FOR CONTROLLING MEMORY DEVICE

CROSS-REFERENCE TO RELATED APPLICATION

This application is based upon and claims the benefit of priority from Japanese Patent Application No. 2017-056416, filed Mar. 22, 2017, the entire contents of which are incorporated herein by reference.

FIELD

Embodiments described herein relate generally to a method for controlling a memory device.

BACKGROUND

Memory devices including three-dimensionally arranged memory cells have been developed. For example, a NAND-type nonvolatile memory device has a structure in which a semiconductor channel passes through a plurality of stacked word lines and a memory cell is formed where the semiconductor channel intersects each word line in the stack. When such a memory cell is utilized as a multivalue memory cell, it is desirable that the threshold values of the memory cells change uniformly with respect to a program voltage which is supplied between the semiconductor channel and the word lines. However, variation in the shape of the semiconductor channel along the stacking direction is inevitable due to manufacturing process limitations and resulting deviations in the threshold voltage of the memory cells in the stack sometimes pose an obstacle to using the memory cell as a multivalue memory cell.

DETAILED DESCRIPTION

Embodiments provide a method for controlling a memory device that can reduce a deviation in the threshold distribution of a memory cell.

In general, according to one embodiment, a memory device, comprises a plurality of word lines stacked in a first direction; a semiconductor channel passing through the plurality of word lines in the first direction; a plurality of memory cells disposed along the semiconductor channel in the first direction, each memory cell including a charge retention film between the semiconductor channel and a respective word line in the plurality of word lines; and a controller connected to the semiconductor channel and the plurality of word lines. The controller is configured to apply a program voltage during a program operation to a memory cell in the plurality of memory cells at a potential that increases in voltage steps, and a voltage increment between the voltage steps decreases during the program operation. The voltage increment is changed depending on a position of the memory cell along the semiconductor channel in the first direction.

Hereinafter, an example embodiment will be described with reference to the drawings. The same aspects in the drawings are identified with the same reference numerals and the detailed explanations of repeated aspects may be omitted as appropriate so that different aspects may be explained. It is to be noted that the drawings are schematic or conceptual drawings and the relationship between the thickness and width of each portion and the size ratio between the portions are not always identical to the actual relationship and size ratio. Moreover, the same portion can be depicted as having different dimensions or ratios in different drawings.

Furthermore, the layout and configuration are described by using an X-axis, a Y-axis, and a Z-axis which are depicted in each drawing. The X-axis, the Y-axis, and the Z-axis intersect at right angles and represent an X direction, a Y direction, and a Z direction, respectively. Moreover, the description is sometimes given by regarding one direction along the Z direction being referred to as "up" or "above" and the opposite direction along the Z direction may be referred as "down" or "below."

Figure 1:
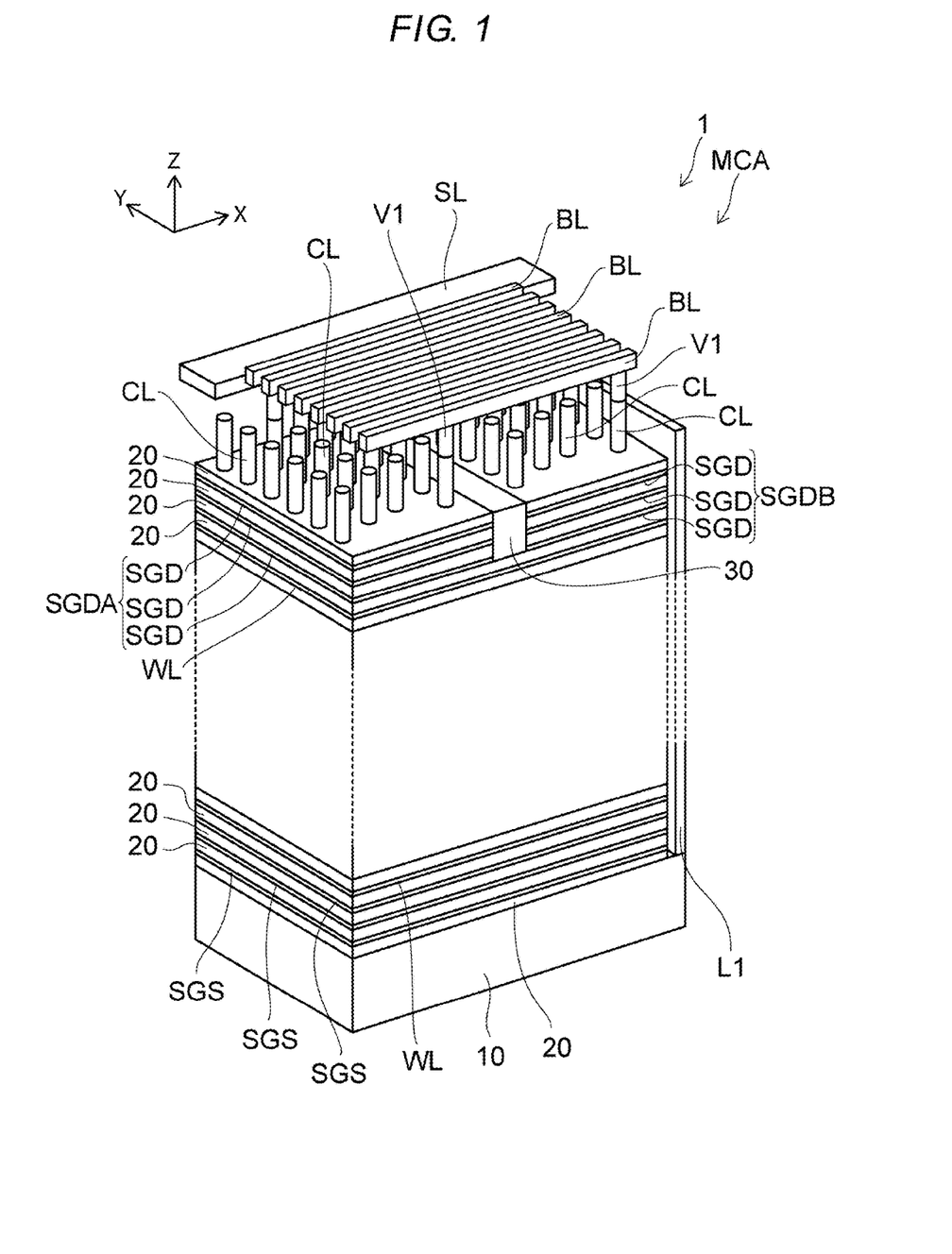
FIG. 1 is a schematic perspective view depicting a memory device according to an embodiment.

FIG. 1 is a perspective view schematically depicting a memory cell array MCA of a memory device 1 according to an embodiment. The memory device 1 is, for example, a NAND-type nonvolatile memory device and includes three-dimensionally arranged memory cells.

As depicted in FIG. 1, the memory device 1 includes a conductive layer 10 (hereinafter referred to as a source layer 10), selection gates SGS, word lines WL, and selection gates SGD. The selection gates SGS are stacked on the source layer 10 with interlayer insulating films 20 sandwiched between the selection gates SGS. The word lines WL are stacked on the selection gates SGS with the interlayer insulating films 20 sandwiched between the word lines WL. The selection gates SGD are stacked on the word lines WL with the interlayer insulating films 20 sandwiched between the selection gates SGD. The selection gates SGS, the word lines WL, and the selection gates SGD spread outward in the X and Y directions as generally planar or plate-like components.

The selection gates SGD are divided by an insulating layer 30, for example. The insulating layer 30 is provided above the word lines WL and extends in the Y direction. As a result, on the word lines WL, a selection gate SGDA and a selection gate SGDB are disposed side by side. The selection gates SGDA and SGDB each include a plurality of selection gates SGD, for example.

The source layer 10 can be a P-type well which is provided in a silicon substrate (not separately depicted in the drawing), for example. The source layer 10 may instead be a polysilicon layer which is provided on a silicon substrate with an interlayer insulating film placed therebetween. The selection gates SGS, the word lines WL, and the selection gates SGD are metal layers containing tungsten (W), for example. The interlayer insulating films 20 and the insulating layer 30 are insulators containing silicon oxide, for example.

The memory device 1 further includes a plurality of columnar bodies CL. The columnar bodies CL pass through the selection gates SGS, the word lines WL, and the selection gates SGD and extend in the Z direction, which is a stacking direction of the word lines WL. The memory device 1 further includes a plurality of bit lines BL and a source line SL which are provided above the selection gates SGD.

The columnar body CL is electrically connected to the bit line BL via a contact plug V1. For example, one of the columnar bodies CL sharing the selection gate SGDA and one of the columnar bodies CL sharing the selection gate SGDB are electrically connected to one bit line BL. The source line SL is electrically connected to the source layer 10 via a source contact LI. The source contact LI is a flat plate-shaped electric conductor which extends in the Y and Z directions along the side faces of the selection gates SGS, the word lines WL, and the selection gates SGD.

In FIG. 1, to depict the internal structure of the memory device 1 more clearly, an insulating layer 23 (see FIG. 2B), which is provided between the source contact LI and the word lines WL and between source contact LI and the selection gates SGS and SGD, is not specifically depicted. Likewise, an interlayer insulating film 25 (see FIG. 2B), which is provided between the selection gates SGD and the bit lines BL is also not specifically depicted in FIG. 1).

Figure 2A:
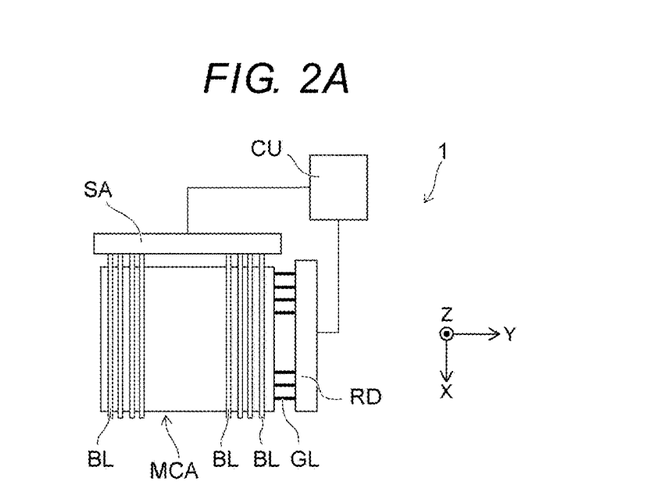
FIGS. 2A and 2B are schematic diagrams depicting a memory device according to an embodiment.
Figure 2B:
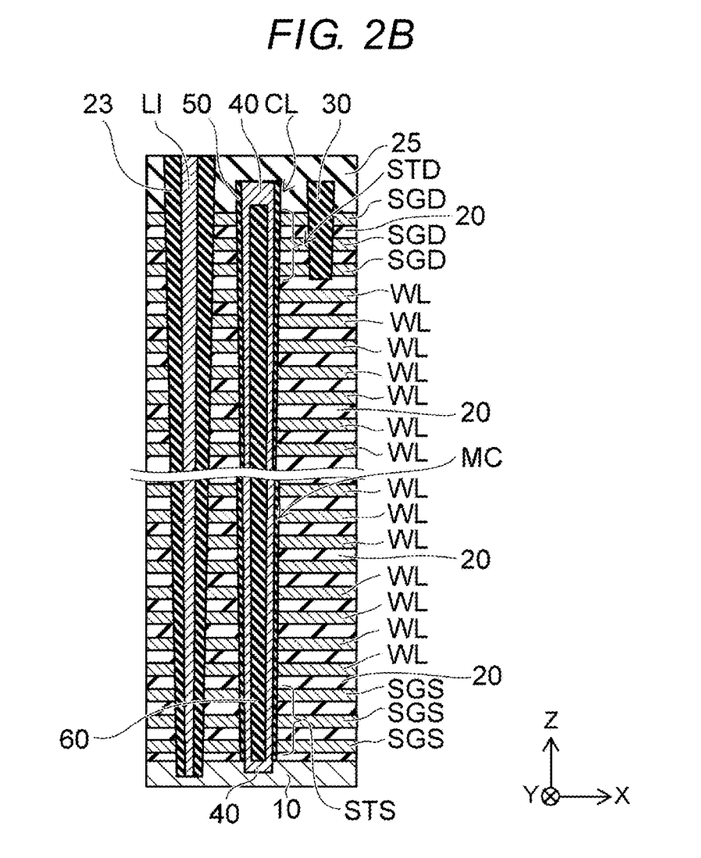

FIGS. 2A and 2B are schematic diagrams depicting the memory device 1. FIG. 2A is a block diagram depicting the configuration of the memory device 1. FIG. 2B is a schematic diagram depicting part of a cross section along an X-Z plane.

As depicted in FIG. 2A, the memory device 1 includes the memory cell array MCA, a sense amplifier SA, a row decoder RD, and a control unit CU. The sense amplifier SA is electrically connected to the memory cell array MCA via the bit lines BL. The row decoder RD is electrically connected to the memory cell array MCA via gate wiring GL. The control unit CU controls operations of the memory cell array MCA via the sense amplifier SA and the row decoder RD.

The sense amplifier SA, the row decoder RD, and the control unit CU are provided in a circuit disposed around the periphery of memory cell array MCA, for example. Moreover, the sense amplifier SA, the row decoder RD, and the control unit CU do not necessarily have to be disposed in the circuit as discrete or separated regions, and, in general, the circuit only has to provide the functions of the sense amplifier SA, the row decoder RD, and the control unit CU.

As depicted in FIG. 2B, a plurality of electrode layers (SGS, WL, SGD) are stacked on the source layer 10 with the interlayer insulating films 20 sandwiched therebetween. The plurality of electrode layers are electrically connected to the row decoder RD via the gate wiring GL. Some portion of the plurality of electrode layers function as the selection gates SGS, another portion as the word lines WL, and yet another portion the selection gates SGD by potentials which are supplied thereto from the row decoder, for example.

The columnar body CL passes through these electrode layers in the Z direction and includes, for example, a semiconductor channel 40, an insulating layer 50, and an insulating core 60. The insulating core 60 extends within the columnar body CL in the Z direction. The semiconductor channel 40 surrounds the outer surface of the insulating core 60 and extends in the Z direction along the insulating core 60. The insulating layer 50 extends in the Z direction between the electrode layers and the semiconductor channel 40. The insulating layer 50 surrounds the outer surface of the semiconductor channel 40.

The source contact LI divides the electrode layers and is connected to the source layer 10. Between the source contact LI and the electrode layers, the insulating layer 23 is provided and electrically separates the source contact LI and the electrode layers.

In the memory device 1, where the semiconductor channel 40 passes through a word line WL, a memory cell MC is provided. In the insulating layer 50, a portion between the semiconductor channel 40 and each word line WL functions as a charge retention layer of the memory cell MC. The semiconductor channel 40 functions as a channel which is shared by a plurality of memory cells MC, and each word line WL functions as a control gate of the memory cell MC. The insulating layer 50 retains charges which are injected from the semiconductor channel 40 by a potential difference between the word line WL and the semiconductor channel 40 and releases the charges to the semiconductor channel 40, for example.

At a portion of the semiconductor channel 40 passing through the plurality of selection gates SGS, a select transistor STS is provided. Moreover, at a portion of the semiconductor channel 40 passing through the plurality of selection gates SGD, a select transistor STD is provided. The semiconductor channel 40 also functions as a channel of the select transistors STD and STS, and the selection gates SGS and SGD function as gate electrodes of the select transistors STD and STS, respectively. Part of the insulating layer 50 which is located between the semiconductor channel 40 and the selection gates SGS and part of the insulating layer 50 which is located between the semiconductor channel 40 and the selection gates SGD function as gate insulating films.

Figure 3A:
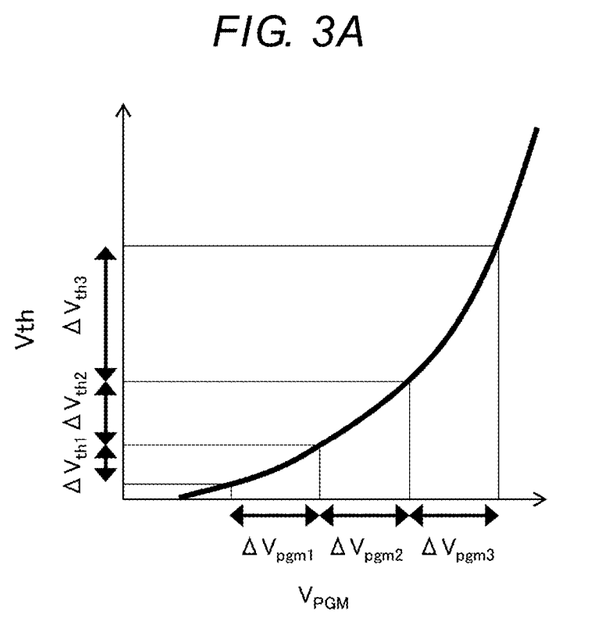
FIGS. 3A and 3B are schematic diagrams depicting a programming method of a memory device according to an embodiment.
Figure 3B:
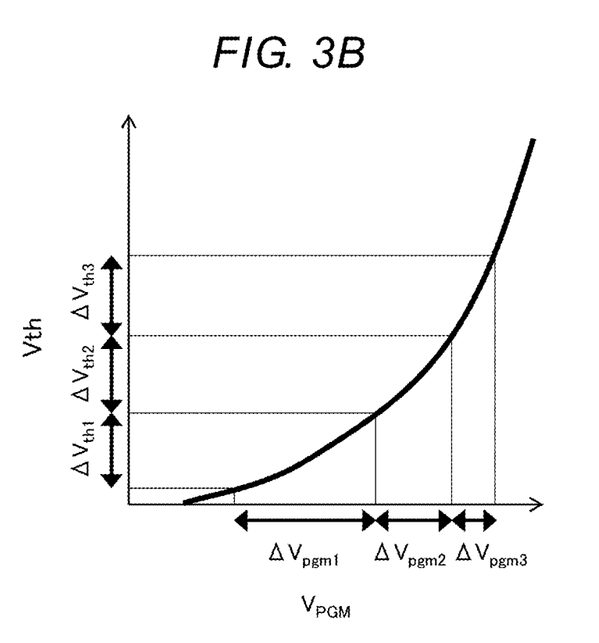

FIGS. 3A and 3B are schematic diagrams depicting a programming method of memory cells MC in the memory device 1 according to the embodiment. FIGS. 3A and 3B are graphs depicting the relationship between a program voltage $V_{PGM}$ and the threshold value $V_{th}$ of a memory cell MC. A horizontal axis represents the program voltage $V_{PGM}$ which is supplied between the semiconductor channel 40 and the word lines WL, and a vertical axis represents the threshold value $V_{th}$ of the memory cell MC.

As depicted in FIG. 3A, the characteristics of the threshold voltage $V_{th}$ of the memory cell MC are that an increment $\Delta V_{th}$ of the threshold voltage $V_{th}$ becomes gradually larger in relation to an increment $\Delta V_{pgm}$ of the program voltage $V_{PGM}$. That is, if the increment $\Delta V_{pgm}$ of the program voltage $V_{PGM}$ is assumed to be constant (that is, $\Delta V_{pgm1}=\Delta V_{pgm2}=\Delta V_{pgm3}$), the increment $\Delta V_{th}$ of the threshold voltage $V_{th}$ is not constant and becomes larger as in the following order $\Delta V_{th1}<\Delta V_{th2}<\Delta V_{th3}$.

However, when the threshold voltage $V_{th}$ is set to turn the memory cell MC into a multivalued, non-binary value memory cell MC, preferably, the increment $\Delta V_{th}$ of the threshold voltage $V_{th}$ of the memory cell MC set in relation to the increment $\Delta V_{pgm}$ of the program voltage $V_{PGM}$ will be constant.

In an example depicted in FIG. 3B, the program voltage $V_{PGM}$ is changed so that the increment $\Delta V_{th}$ of the threshold voltage $V_{th}$ becomes constant ($\Delta V_{th1}=\Delta V_{th2}=\Delta V_{th3}$). In this case, the increment $\Delta V_{PGM}$ of the program voltage $V_{PGM}$ becomes smaller in the following order $\Delta V_{pgm1}>\Delta V_{pgm2}>\Delta V_{pgm3}$.

Figure 4:
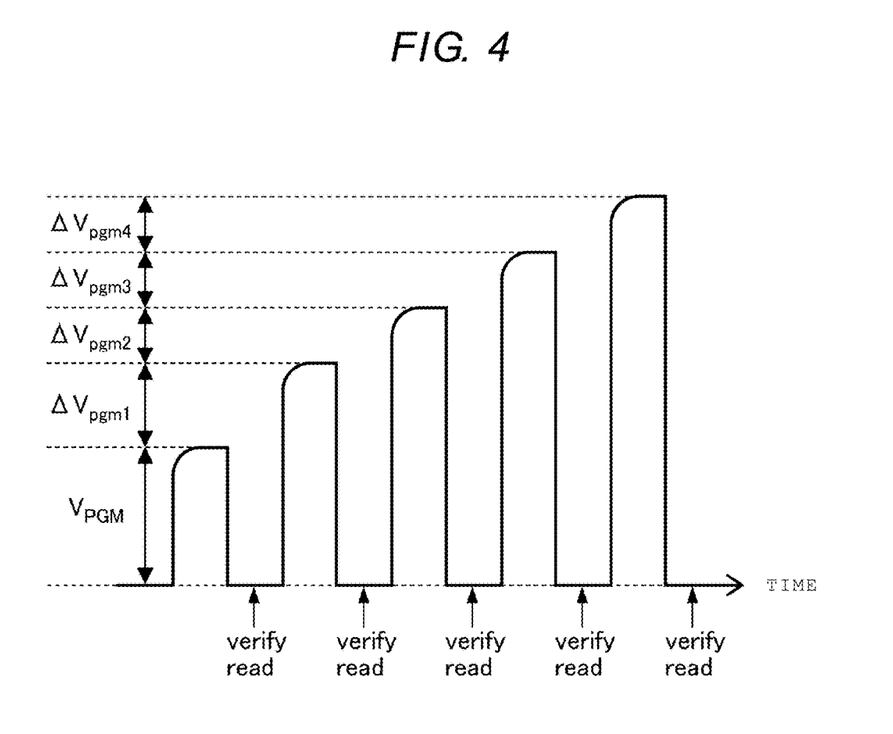
FIG. 4 is a schematic diagram depicting a program voltage of a memory device according to an embodiment.

FIG. 4 is a schematic diagram depicting the program voltage $V_{PGM}$ of the memory device 1 according to an embodiment. In an example depicted in FIG. 4, the program voltage $V_{PGM}$ is adjusted in a plurality of voltage steps. A potential of each voltage step increases with time, and the increment $\Delta V_{pgm}$ thereof becomes smaller in order ($\Delta V_{pgm1} > \Delta V_{pgm2} > \Delta V_{pgm3} > \Delta V_{pgm4}$) so that the increment $\Delta V_{th}$ of the threshold voltage $V_{th}$ of the memory cell MC is constant. Moreover, between the voltage steps, a so-called verify read is performed to verify the threshold voltage $V_{th}$ of the memory cell MC has been set as intended.

Figure 5A:
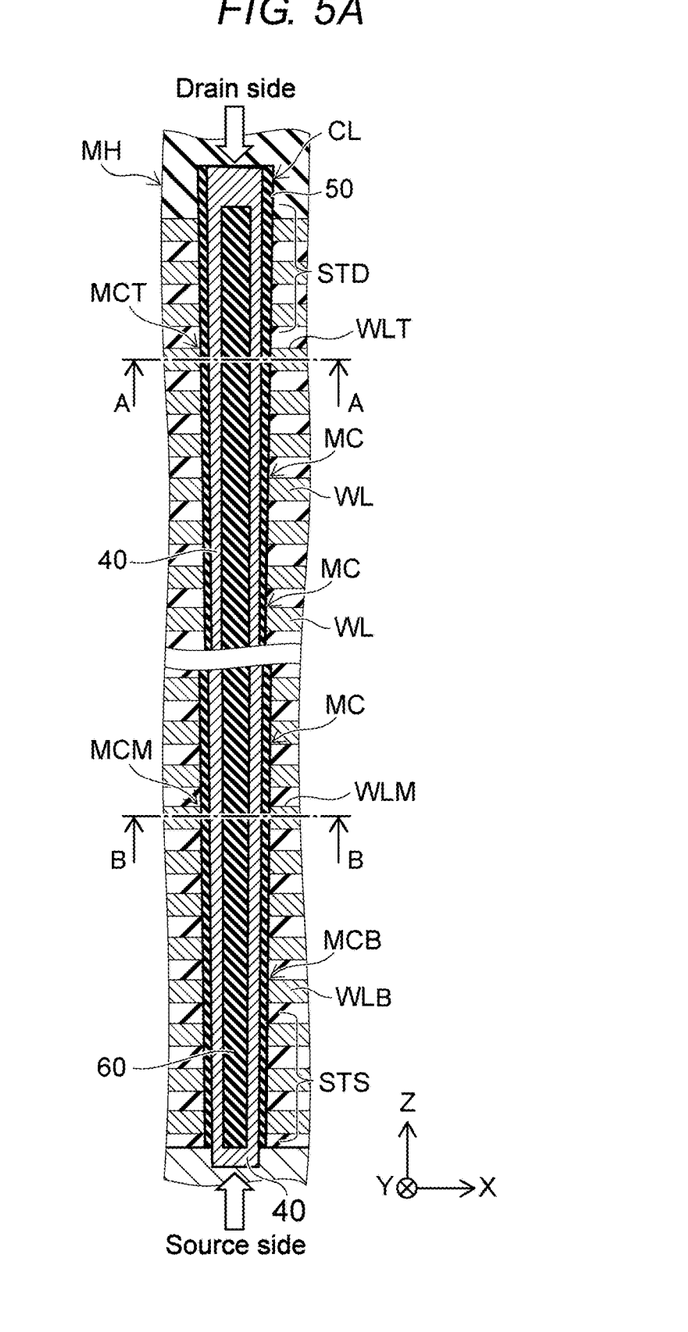
FIGS. 5A to 5C are schematic diagrams depicting a semiconductor channel of a memory device according to an embodiment.
Figure 5B:
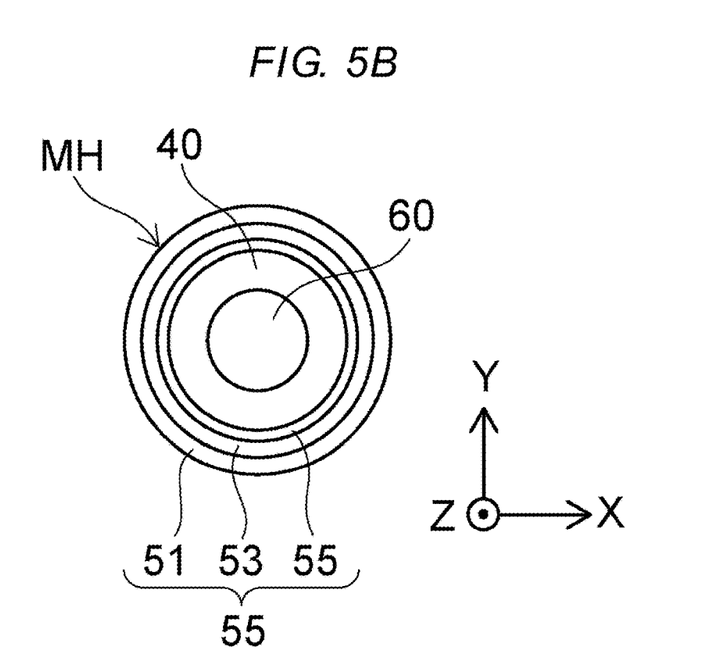
Figure 5C:
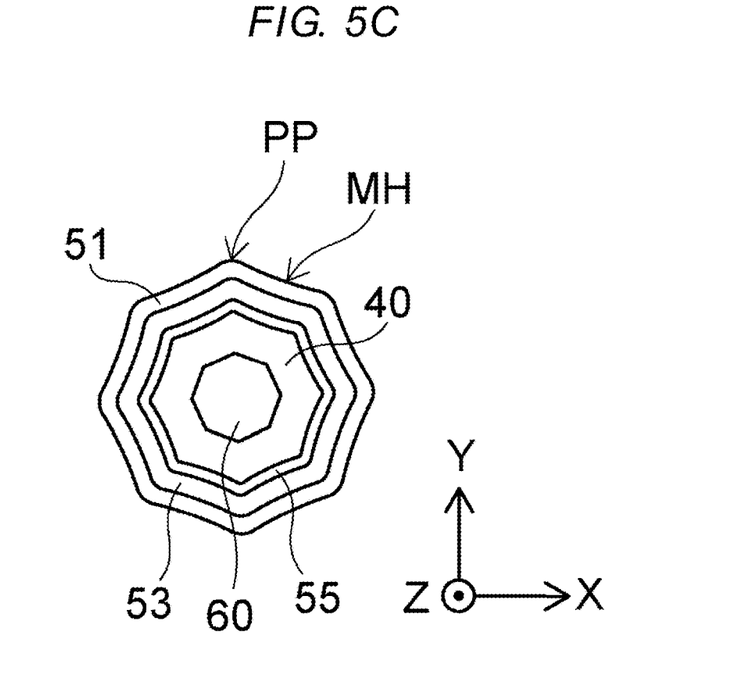

FIGS. 5A to 5C are schematic diagrams depicting the columnar body CL of the memory device 1. FIGS. 5B and 5C are schematic diagrams depicting the cross sections taken along line A-A and line B-B depicted in FIG. 5A.

As depicted in FIG. 5A, the columnar body CL is provided in a memory hole MH which extends in the Z direction while passing through the word lines WL and the selection gates SGS and SGD, for example. That is, the columnar body CL includes the insulating layer 50 and the semiconductor channel 40 which are stacked in order on the inner wall of the memory hole MH. Furthermore, the columnar body CL includes the insulating core 60 with which the inside of the memory hole MH is filled.

As depicted in FIGS. 5B and 5C, the insulating layer 50 includes a first layer 51, a second layer 53, and a third layer 55 which are stacked in order from the inner wall of the memory hole MH. The first layer 51 and the third layer 55 are silicon oxide films, for example, and the second layer 53 is a silicon nitride film, for example. The semiconductor channel 40 contains, for example, polysilicon, and the insulating core 60 contains, for example, silicon oxide.

In order to increase the storage capacity of the memory device 1, the number of stacked word lines WL can be increased and/or the diameter of the columnar body CL can be reduced. As a result, the aspect ratio (the height in the Z direction/the width in the X direction) of the columnar body CL is increased. However, forming a columnar body CL to have s a uniform diameter (or width) that is constant over the full length of the columnar body CL along the Z direction is difficult.

As depicted in FIG. 5B, the cross section of the columnar body CL passing through a word line WLT (a topmost word line WL) closest to the end of the semiconductor channel 40 on the drain side thereof has a shape close to a perfect circle, for example. By contrast, as depicted in FIG. 5C, the cross section of the columnar body CL passing through a word line WLM (a lower word line WL) located between the drain end and the source end of the semiconductor channel 40 has a shape approaching a polygon, for example. As a result, a memory cell MCM located between the semiconductor channel 40 and the word line WLM has characteristics different from the characteristics of a memory cell MCT located between the semiconductor channel 40 and the word line WLT.

Figure 6:
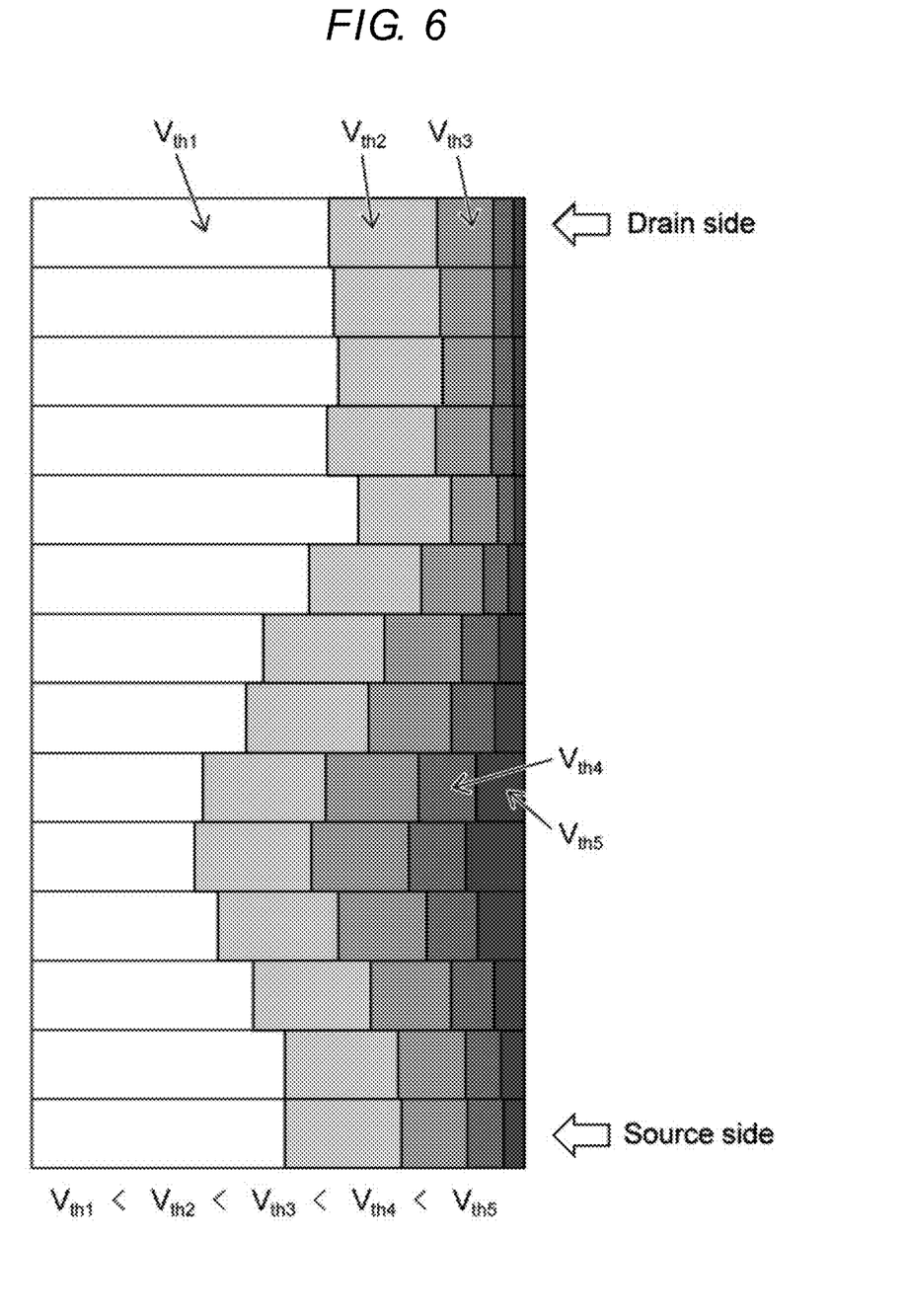
FIG. 6 is a schematic diagram depicting the threshold distribution of a memory cell in a memory device according to a comparative example.

FIG. 6 is a schematic diagram depicting the threshold distribution of a memory cell MC in a memory device according to a comparative example. FIG. 6 is a histogram depicting the distribution of threshold voltages $V_{th}$ which is observed when the same program voltage $V_{PGM}$ is supplied to each memory cells MC disposed along the length of the semiconductor channel 40. The regions $V_{th1}$ to $V_{th5}$ depicted in FIG. 6 correspond to threshold voltages of the memory cell MC and have the relationship: $V_{th1} < V_{th2} < V_{th3} < V_{th4} < V_{th5}$. FIG. 6 depicts the ratio among the threshold voltages $V_{th1}$ to $V_{th5}$ for different positions along the semiconductor channel 40 in the Z-direction.

As is clear from FIG. 6, the ratio between the high threshold values $V_{th4}$ and $V_{th5}$ in the memory cell MCM located between the source end and the drain end is higher than the ratio between the high threshold values $V_{th4}$ and $V_{th5}$ in the memory cell MCT, which is closest to the drain end. Moreover, the ratio between the high threshold values $V_{th4}$ and $V_{th5}$ in the memory cell MCM is higher than the ratio between the high threshold values $V_{th4}$ and $V_{th5}$ in a memory cell MCB (see FIG. 5A) located between a word line WLB closest to the source end and the semiconductor channel 40. As described above, the distribution of the threshold voltages $V_{th}$ thus changes depending on the particular position of the memory cell MC along the semiconductor channel 40.

Figure 7A:
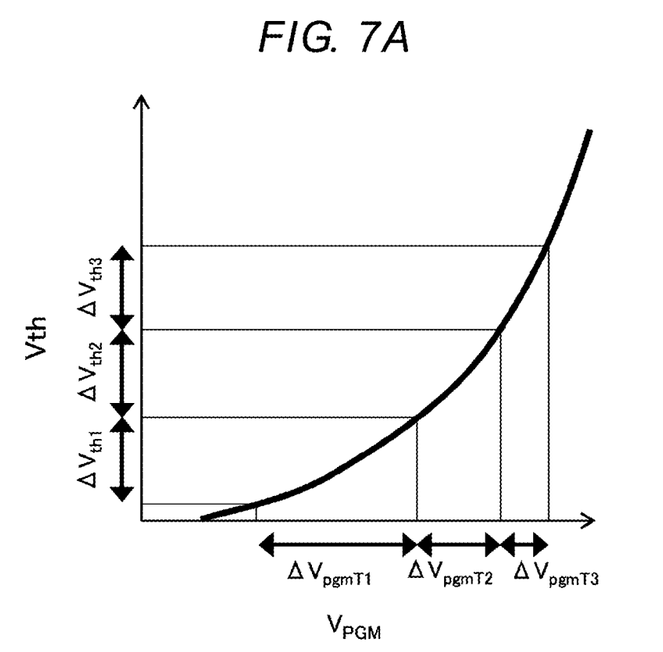
FIGS. 7A and 7B are schematic diagrams depicting the programming method of a memory device according to an embodiment.
Figure 7B:
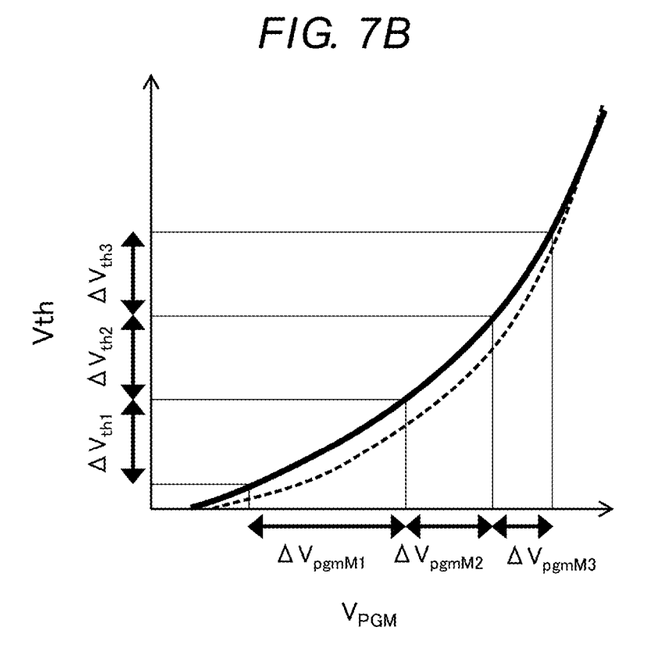

FIGS. 7A and 7B are schematic diagrams depicting a programming method of the memory device 1. FIGS. 7A and 7B are graphs depicting the relationship between the program voltage $V_{PGM}$ and the threshold voltage $V_{th}$ of a memory cell MC.

FIG. 7A is a graph depicting the characteristics of the memory cell MCT closest to the drain end of the semiconductor channel 40. For instance, in order to make an increment $\Delta V_{th}$ of the threshold voltage $V_{th}$ of the memory cell MCT constant, desirably, increments $\Delta V_{pgmT}$ of the program voltage $V_{PGM}$ are lessened in the order $\Delta V_{pgm1T} > \Delta V_{pgm2T} > \Delta V_{pgm3T}$.

FIG. 7B is a graph depicting the characteristics of the memory cell MCM located between the source end and the drain end of the semiconductor channel 40. A dashed line in FIG. 7B indicates the characteristics of the memory cell MCT for comparison.

As depicted in FIG. 7B, the threshold voltage $V_{th}$ of the memory cell MCM is higher than the threshold voltage $V_{th}$ of the memory cell MCT with respect to the same program voltage $V_{PGM}$. This is thought to be caused by the curvature of a corner portion PP (see FIG. 5C) in the cross section of the columnar body CL being greater than the curvature of a perfect circle (see FIG. 5A), the electric field strength of the corner portion PP becomes higher. That is, an increase in the electric field strength at the corner portion PP in the memory cell MCM presumably increases carrier injection into the insulating layer 50 from the semiconductor channel 40 and the threshold voltage $V_{th}$ of the memory cell MCM becomes higher than that of the memory cell MCT having the shape of a perfect circle.

For this reason, desirably, an increment $\Delta V_{pgmM}$ of the program voltage $V_{PGM}$ that is supplied to the memory cell MCM is made smaller than an increment $\Delta V_{pgmT}$ in the memory cell MCT ($\Delta V_{pgm1M} < \Delta V_{pgm1T}$). As a result, a deviation of the threshold voltage distribution that depends on the position of the memory cell MC along the semiconductor channel 40 can be prevented.

It is to be noted that, a difference in an increment $\Delta V_{pgm}$ between the memory cell MCT and the memory cell MCM may be small in a portion in which the potential of a voltage step in the program voltage $V_{PGM}$ is high. For example, settings may be made such that $\Delta V_{pgm2T} \approx \Delta V_{pgm2M}$ and $\Delta V_{pgm3T} \approx \Delta V_{pgm3M}$. That is, by making an increment $\Delta V_{pgm}$ in the memory cell MCT and an increment $\Delta V_{pgm}$ in the memory cell MCM different in a low-potential voltage step, an increment $\Delta V_{th}$ of the threshold voltage $V_{th}$ can be made uniform between the memory cell MCT and the memory cell MCM and a deviation of the threshold distribution of the memory cell MC can be prevented. Moreover, the same goes for an increment $\Delta V_{th}$ of the threshold voltage $V_{th}$ between the memory cell MCB and the memory cell MCM (see FIG. 6).

Figure 8:
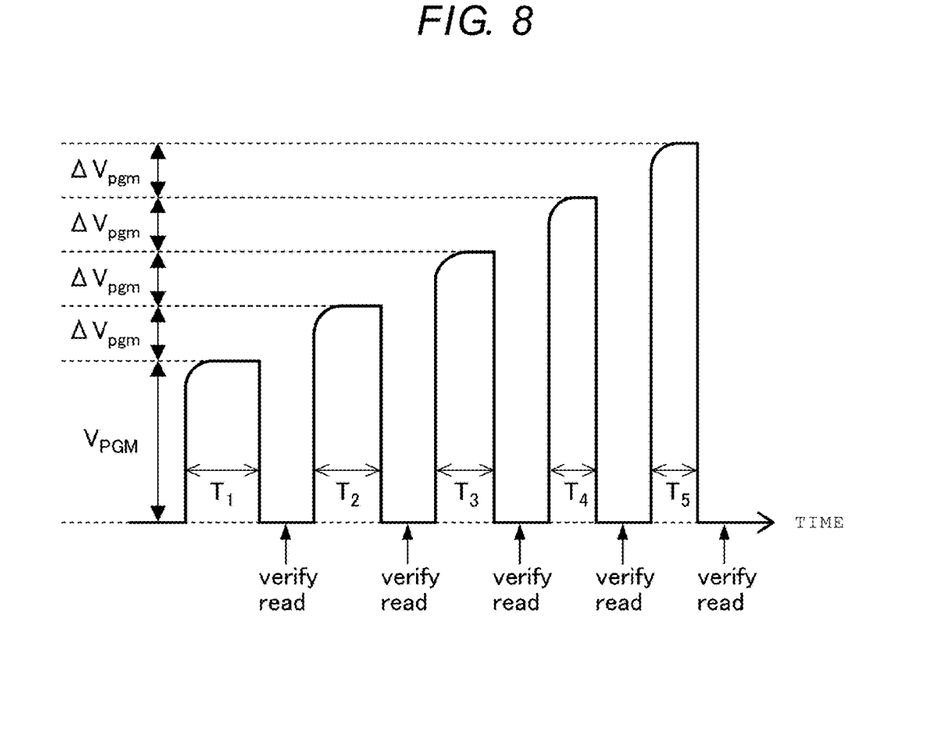
FIG. 8 is a schematic diagram depicting a program voltage of a memory device according to a modified example of an embodiment.

FIG. 8 is a schematic diagram depicting the programming method of the memory device 1 according to a modified example of an embodiment. In this modified example, an increment $\Delta V_{pgm}$ of the program voltage $V_{PGM}$ is made constant but the width of a voltage step is reduced with time such that $T_1<T_2<T_3<T_4<T_5$. By doing so, an increment $\Delta V_{th}$ of the threshold voltage $V_{th}$ of the memory cell MC can be made constant and the accuracy of control of the threshold voltage $V_{th}$ can be improved.

Furthermore, by changing the widths $T_1$ to $T_5$ of the voltage steps, preferably, the widths of low-potential voltage steps, for instance, $T_1$ and $T_2$ in accordance with the position of the memory cell MC along the semiconductor channel 40, a deviation of the threshold voltage distribution of the memory cell MC is prevented. For example, a difference between durations $T_1$ and $T_2$ in the program voltage $V_{PGM}$ which is supplied to the memory cell MCT is larger than a difference between durations $T_1$ and $T_2$ in the program voltage $V_{PGM}$ which is supplied to the memory cell MCM. Moreover, a difference between durations $T_1$ and $T_2$ in the program voltage $V_{PGM}$ which is supplied to the memory cell MCB closest to the source end is larger than a difference between durations $T_1$ and $T_2$ in the program voltage $V_{PGM}$ which is supplied to the memory cell MCM.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device, comprising:
    a plurality of word lines stacked in a first direction;
    a semiconductor channel passing through the plurality of word lines in the first direction;
    a plurality of memory cells disposed along the semiconductor channel in the first direction, each memory cell including a charge retention film between the semiconductor channel and a respective word line in the plurality of word lines; and
    a controller connected to the semiconductor channel and the plurality of word lines and configured to:
    apply a program voltage during a program operation to a memory cell in the plurality of memory cells at a potential that increases in voltage steps, and a voltage increment between the voltage steps decreases during the program operation, wherein
    the semiconductor channel has a source end and a drain end, and
    a difference in potential between a first voltage step of the program voltage in the program operation and a second voltage step in the program operation of the program voltage supplied to a first memory cell closest to the drain end is larger than a difference in potential between a first voltage step of the program voltage in the program operation and a second voltage step of the program voltage in the program operation supplied to a second memory cell located between the first memory cell and the source end.

2. The memory device according to claim 1, wherein a difference in potential between a first voltage step and a second voltage step of a program voltage that is supplied to a first memory cell closest to the source end is larger than the difference in potential between the first voltage step and the second voltage step of the program voltage in the program operation supplied to the second memory cell located between the first memory cell and the source end.

3. The memory device according to claim 1, wherein the plurality of memory cells are NAND-type memory cells.

4. The memory device according to claim 1, wherein the controller is further configured to perform a verify read between after each application of the program voltage.

5. The memory device according to claim 1, wherein at least one of a diameter or a shape of the semiconductor channel varies along the first direction.

6. A memory device, comprising:
    a plurality of word lines stacked in a first direction;
    a semiconductor channel passing through the plurality of word lines in the first direction;
    a plurality of memory cells disposed along the semiconductor channel in the first direction, each memory cell including a charge retention film between the semiconductor channel and a respective word line in the plurality of word lines; and
    a controller connected to the semiconductor channel and the plurality of word lines and configured to:
    apply a program voltage during a program operation to a memory cell in the plurality of memory cells at a potential that increases in voltage steps, and a duration of the applied program voltage at each voltage step decreases during the program operation, wherein
    the semiconductor channel includes a source end and a drain end, and
    a difference in the duration of the applied program voltage at a first voltage step of the program voltage in the program operation and the duration of the applied program voltage at a second voltage step of the program voltage in the program operation supplied to a first memory cell closest to the drain end is larger than a difference in the duration of the applied program voltage a first voltage step of the program voltage in the program operation and the duration of the applied program voltage at a second voltage step of the program voltage of the program supplied to a second memory cell that is located between the first memory cell and the source end.

7. The memory device according to claim 6, wherein the plurality of memory cells are NAND-type memory cells.

8. The memory device according to claim 6, wherein the controller is further configured to perform a verify read between after each application of the program voltage.

9. The memory device according to claim 6, wherein at least one of a diameter or a shape of the semiconductor channel varies along the first direction.

10. A method of controlling a data writing operation of a memory device having a plurality of word lines stacked in a direction and a semiconductor channel passing through the plurality of word lines in the first direction, the method comprising:
    applying a program voltage to a first memory cell on a first end side of the semiconductor channel in a first series of increasing voltage steps;
    applying a program voltage to a second memory cell between the first memory cell and a second end side of the semiconductor channel in a second series of increasing voltage steps, wherein
    the first series and the second series include at least one of different voltage step increments and different program voltage application times voltage steps in the first series increase during the program operation by different increment sizes,
voltage steps in the second series increase during the program operation by different increment sizes, and
increment sizes of the first series are larger than corresponding increment sizes of the second series.

11. The method according to claim 10, wherein
voltage steps in the first series have different application duration times during the program operation,
voltage steps in the second series have different application duration times during the program operation, and
application duration times of the first series are different from the corresponding application duration times of the second series.

12. The method according to claim 10, wherein the first end side is a source end side.

13. The method according to claim 10, wherein the memory device is a NAND-type semiconductor memory device.

14. The method according to claim 10, wherein at least one of a diameter or a shape of the semiconductor channel varies along the first direction.

15. The method according to claim 10, wherein a verify read is performed after each application of the program voltage.

16. The memory device according to claim 1, wherein the voltage increment is changed depending on a position of the memory cell along the semiconductor channel in the first direction.

17. The memory device according to claim 6, wherein a difference in the duration of the applied program voltage at each voltage step changes depending on a position of the memory cell along the semiconductor channel in the first direction.

* * * * *